United States Patent
Yee et al.

(10) Patent No.: US 8,937,372 B2
(45) Date of Patent: Jan. 20, 2015

(54) INTEGRATED CIRCUIT PACKAGE SYSTEM WITH MOLDED STRIP PROTRUSION

(75) Inventors: Jae Hak Yee, Singapore (SG); Junwoo Myung, Kyungsang-do (KR)

(73) Assignee: STATS ChipPAC Ltd., Singapore (SG)

( * ) Notice: Subject to any disclaimer, the term of this patent is extended or adjusted under 35 U.S.C. 154(b) by 1311 days.

(21) Appl. No.: 11/689,317

(22) Filed: Mar. 21, 2007

(65) Prior Publication Data

US 2008/0230883 A1 Sep. 25, 2008

(51) Int. Cl.
- *H01L 21/02* (2006.01)
- *H01L 23/28* (2006.01)
- *H01L 21/56* (2006.01)
- *H01L 23/31* (2006.01)
- *H01L 23/00* (2006.01)

(52) U.S. Cl.
CPC .......... *H01L 21/561* (2013.01); *H01L 23/3107* (2013.01); *H01L 24/97* (2013.01)
USPC ............ 257/666; 257/676; 257/E21.504; 257/691; 257/692; 257/696; 257/784; 257/E23.039; 257/E23.042; 438/123; 438/106; 438/110

(58) Field of Classification Search
USPC ............ 257/E21.504, E23.055; 438/125, 118
See application file for complete search history.

(56) References Cited

U.S. PATENT DOCUMENTS

| | | | | |
|---|---|---|---|---|
| 3,748,980 A * | 7/1973 | Brandt et al. | ............... | 396/197 |
| 4,408,170 A * | 10/1983 | Rapeli et al. | ............... | 333/172 |
| 5,834,339 A * | 11/1998 | Distefano et al. | ............ | 438/125 |
| 5,859,475 A * | 1/1999 | Freyman et al. | ............. | 257/738 |
| 6,104,095 A | 8/2000 | Shin et al. | | |
| 6,202,853 B1 * | 3/2001 | Bianca et al. | ............... | 206/713 |
| 6,281,047 B1 * | 8/2001 | Wu et al. | ...................... | 438/113 |
| 6,448,111 B1 * | 9/2002 | Fujisawa et al. | ............ | 438/123 |
| 6,611,047 B2 | 8/2003 | Hu et al. | | |
| 6,759,279 B2 * | 7/2004 | Fujisawa et al. | ............ | 438/123 |
| 6,939,740 B2 | 9/2005 | Yamaguchi | | |
| 7,119,421 B2 * | 10/2006 | Rohrmoser et al. | ......... | 257/666 |
| 7,432,586 B2 * | 10/2008 | Zhao et al. | .................... | 257/685 |
| 7,790,500 B2 | 9/2010 | Ramos et al. | | |
| 7,968,981 B2 * | 6/2011 | Yee et al. | ..................... | 257/669 |
| 8,501,540 B2 * | 8/2013 | Yee et al. | ..................... | 438/111 |
| 2002/0006718 A1 * | 1/2002 | Distefano | .................... | 438/617 |
| 2002/0168797 A1 * | 11/2002 | DiStefano et al. | ............ | 438/106 |
| 2004/0245617 A1 * | 12/2004 | Damberg et al. | ............ | 257/686 |
| 2005/0173793 A1 * | 8/2005 | Rohrmoser et al. | ......... | 257/724 |

* cited by examiner

*Primary Examiner* — Zandra Smith
*Assistant Examiner* — Tsz Chiu
(74) *Attorney, Agent, or Firm* — Ishimaru & Associates LLP

(57) ABSTRACT

An integrated circuit package system includes an in-line strip, attaching an integrated circuit die over the in-line strip, and applying a molding material with a molded segment having a molded strip protrusion formed therefrom over the in-line strip.

20 Claims, 5 Drawing Sheets

INTEGRATED CIRCUIT PACKAGE SYSTEM WITH MOLDED STRIP PROTRUSION

TECHNICAL FIELD

The present invention relates generally to integrated circuit package systems, and more particularly to a system for integrated circuit packages with mold segment.

BACKGROUND ART

Modern consumer electronics particularly personal portable devices, such as cellular phones, digital cameras, and music players, require increasing integrated circuit die content to fit an ever-shrinking physical space as well as increased manufacturing throughput. These demands for smaller, higher performance semiconductor devices, which support portable electronic devices, have motivated the development of new techniques for producing smaller and less expensive semiconductor devices. One of these technologies involves packaging the integrated circuit die in as small a form factor as possible and manufacturing the integrated circuit die as efficiently as possible.

Typically, the manufacture of an IC package from the raw-material stage to the finished product involves many and varied processes. In the case of lead frame packages, semi-conductor die are first bonded to a lead frame strip by a bonding agent. Thereafter, the lead frame strip is heated in a curing oven to strengthen the bond between the die and the lead frame strip. The die and the lead frame strip are then electrically connected, such as by wire bonding. The die are thereafter encapsulated with a molding material, which is applied over the die and lead frame strip. The molding material is then cured by heating before each encapsulated die is electrically separated from the other die and lead frames, so that each die can be tested while in a mold segment. Each IC package can then be singulated and provided to system assembly.

Conventionally, each apparatus for die-bonding, electrical connectivity, molding, or singulation involves a separate system dedicated to its task, such as a mechanized die-bonder for die attachment or wire-bonder for electrical connection. This often results in functional types of equipment physically separated from other functional types of equipment. In order to transfer each set of lead frame packages in a mold segment processed by one functional type of machine to another functional type of machine, the mold segments processed by one machine are inserted into magazines and transported to another machine for the next stage of the manufacturing production process.

As is well known in the field of integrated circuit packaging, additional steps or equipment can increase processing time and costs. However, additional processing methods and equipment are required for processing of mold segments with magazines for handling and transporting. Attaching additional jigs to mold segments and flipping over of the mold segments are often required with magazines. This is inefficient, and requires skilled operators often performing manual processes. To date, integrated circuit packages have not successfully addressed these and other manufacturing issues. A new approach must be found in order to improve the manufacturing processes and increase the automation and throughput of the integrated circuit package device and methods.

Thus, a need still remains for an integrated circuit package system to improve integrated circuit packages particularly processing, handling, and transporting mold segments. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an in-line strip, attaching an integrated circuit die over the in-line strip, and applying a molding material with a molded segment having a molded strip protrusion formed therefrom over the in-line strip.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
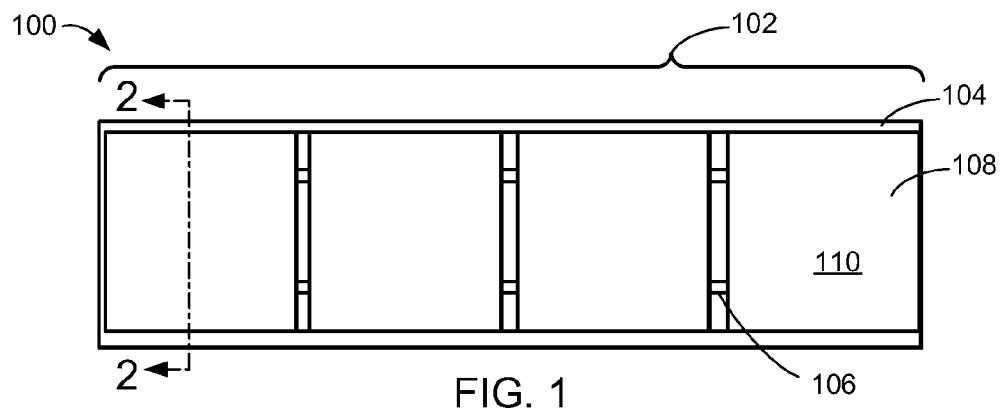
FIG. 1 is a top view of an integrated circuit package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Referring now to FIG. 1, therein is shown a top view of an integrated circuit package system 100 in an embodiment of the present invention. The integrated circuit package system 100, such as a bump chip carrier or a lead frame internal stacking module, includes a molded strip 102 having a molded strip protrusion 104, a molded strip bridge 106, and a molded segment 108. The molded strip 102 including the molded strip protrusion 104, the molded strip bridge 106, and the molded segment 108 can be formed with a molding material 110 such as an epoxy molding compound (EMC). A process, such as encapsulation or molding, can include molds having the shape of the molded strip 102, the molded strip protrusion 104, the molded strip bridge 106, and the molded segment 108.

The molded strip protrusion 104 provides structural integrity to the molded strip 102 and prevents breakage of the molded strip bridge 106. The molded strip 102 can provide a predetermined position or orientation of the molded segment 108 for further processing. The molded strip protrusion 104 can also provide compatibility with backend equipment, such as strip test equipment, designed to accommodate a strip form required guide rail. The molded strip protrusion 104 can function as a guide rail for feeding the molded strip 102 through the strip test equipment, providing a high number of the molded segment 108 through functional or final test, improved contact during testing due to the predetermined position or orientation of the molded segment 108, and reducing time by handling the molded strip 102 having more than one of the molded segment 108. The molded strip protrusion 104 laterally extends beyond the molded segment 108.

Figures 2A, 2B:
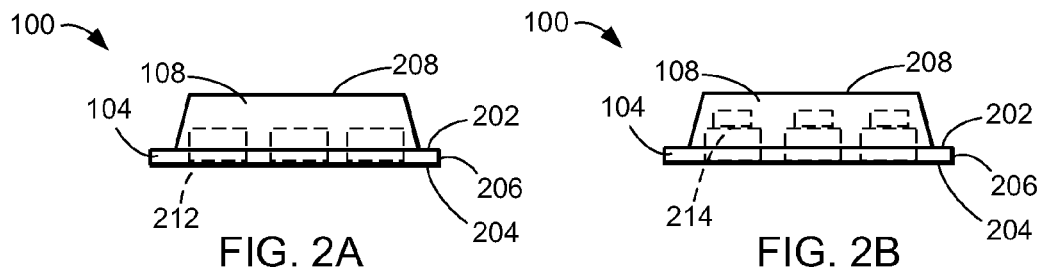
FIGS. 2A and 2B are cross-sectional views of the integrated circuit package system along line segment 2-2 of FIG. 1.

Referring now to FIGS. 2A and 2B, therein are shown cross-sectional views of the integrated circuit package system 100 along line segment 2-2 of FIG. 1. The integrated circuit package system 100 includes the molded strip protrusion 104 and the molded segment 108. As an example, the molded strip protrusion 104 can be formed having a protrusion top surface 202 and a protrusion bottom surface 204. Further as an example, the protrusion top surface 202 and the protrusion bottom surface 204 can be substantially parallel. Yet further, as an example, a protrusion end surface 206 can be formed substantially perpendicular to the protrusion top surface 202 and the protrusion bottom surface 204.

The protrusion top surface 202 and the protrusion bottom surface 204 can be substantially parallel to a mold cap top surface 208 of the molded segment 108. A thickness of the molded strip protrusion 104 is thinner than a thickness of the molded segment 108 or a same thickness as the molded segment 108 to provide a shape of a bar such as a guide rail or strip form. The molded segment 108 can be formed over integrated circuit die 212, such as one or more die, or stacked die 214, such as two or more die stacked one over another. The integrated circuit die 212 is in direct contact with the molded strip protrusion 104.

Figure 3:
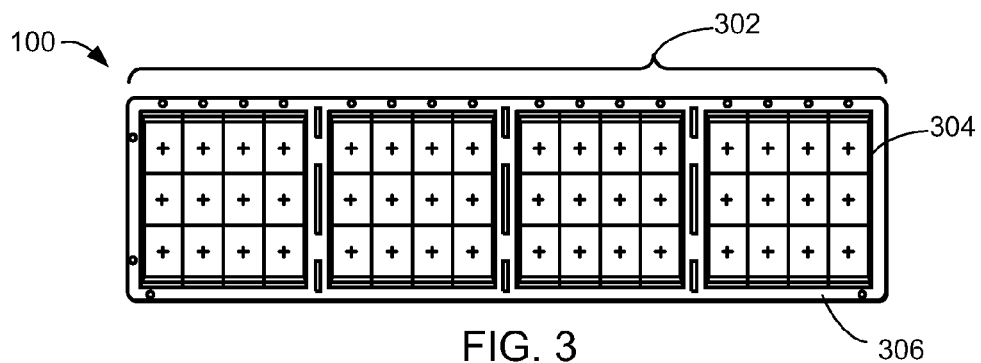
FIG. 3 is a top view of the integrated circuit package system in an in-line strip processing phase.

Referring now to FIG. 3, therein is shown a top view of the integrated circuit package system 100 in an in-line strip processing phase. The integrated circuit package system 100 includes an in-line strip 302, such as a copper lead frame array. The in-line strip 302 includes individual units 304, having in-line strip rails 306 such as guide rails or side rails. The in-line strip rails 306 guide the in-line strip 302 in feeding the in-line strip 302 into processing equipment or handling equipment. Individual testing requires removal, such as etching, of portions of the in-line strip 302 and the in-line strip rails 306.

Figure 4:
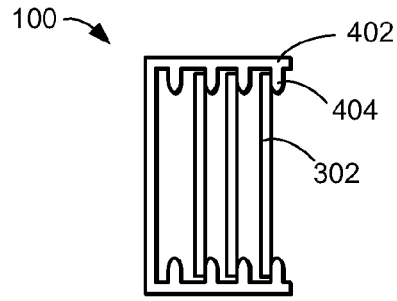
FIG. 4 is a side view of the integrated circuit package system in an in-line strip handling phase.

Referring now to FIG. 4, therein is shown a side view of the integrated circuit package system 100 in an in-line strip handling phase. The in-line strip 302 of the integrated circuit package system 100 can be placed in a slot magazine 402. The in-line strip 302 fits between and extends beyond inner extents of slot spacers 404. The slot magazine 402 provides protection for handling or transporting one or more of the in-line strip 302. The slot magazine 402 can be used between manufacturing processes, such as bonding and electrical connection, or with manufacturing processes directly compatible with the slot magazine 402.

Figure 5:
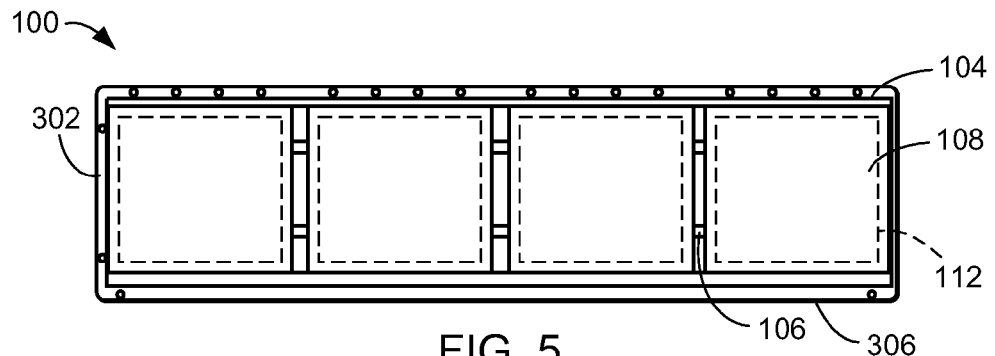
FIG. 5 is a top view of the integrated circuit package system in a molding phase.

Referring now to FIG. 5, therein is shown a top view of the integrated circuit package system 100 in a molding phase. The molded strip protrusion 104, the molded strip bridge 106, and the molded segment 108 are formed over the in-line strip 302 and an area with the integrated circuit die 212 or the stacked die 214. The molded strip protrusion 104 can provide the in-line strip rails 306 of the in-line strip 302 partially exposed. The molded segment 108 can be formed over each of the individual units 304 of FIG. 3. The molded strip bridge 106 can be formed between the molded segment 108 and another of the molded segment 108. The molded strip protrusion 104, the molded strip bridge 106, and the molded segment 108 can be formed of a single material or multiple materials.

Figure 6:
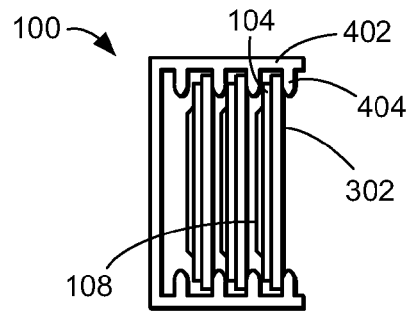
FIG. 6 is a side view of the integrated circuit package system in a molded in-line strip handling phase with the slot magazine.

Referring now to FIG. 6, therein is shown a side view of the integrated circuit package system 100 in a molded in-line strip handling phase with the slot magazine 402. The in-line strip 302 having the molded strip protrusion 104, the molded strip bridge 106, and the molded segment 108 can be placed in the slot magazine 402. The in-line strip 302 fits between and extends beyond the inner extents of the slot spacers 404. The slot magazine 402 provides protection for handling or transporting one or more of the in-line strip 302. The slot magazine 402 can be used between manufacturing processes, such as bonding and electrical connection, or with manufacturing processes directly compatible with the slot magazine 402.

Figure 7:
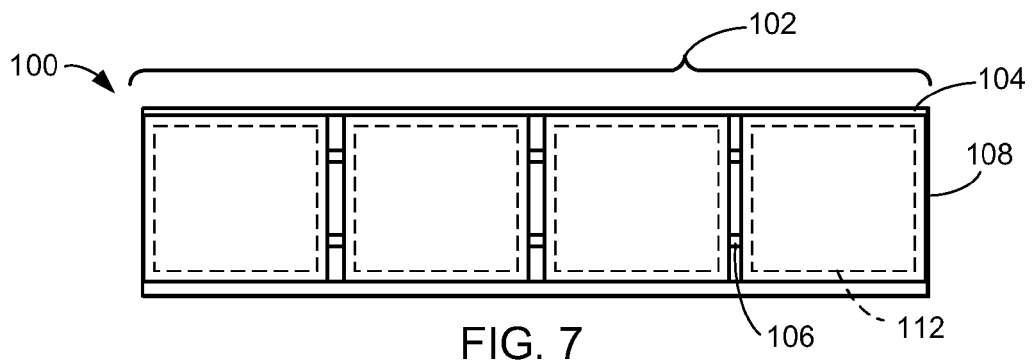
FIG. 7 is a top view of the integrated circuit package system in a strip etch-out phase.

Referring now to FIG. 7, therein is shown a top view of the integrated circuit package system 100 in a strip etch-out phase. The in-line strip 302 of FIG. 3 can be removed to provide electrical singulation of the individual units 304 of FIG. 3 and the integrated circuit die 212 or the stacked die 214. The molded strip protrusion 104, the molded strip bridge 106, and the molded segment 108, form the molded strip 102 and provide structural integrity to the individual units 304.

Figure 8:
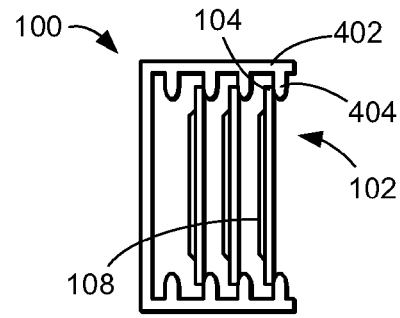
FIG. 8 is a side view of the integrated circuit package system in a strip etch-out molded strip handling phase.

Referring now to FIG. 8, therein is shown a side view of the integrated circuit package system 100 in a strip etch-out molded strip handling phase. The molded strip 102 having the molded strip protrusion 104, the molded strip bridge 106 of FIG. 1, and the molded segment 108 can be placed in the slot magazine 402. The molded strip protrusion 104 fits between and extends beyond the inner extents of the slot spacers 404. The slot magazine 402 provides protection for handling or transporting one or more of the molded strip 102. The slot magazine 402 can be used between manufacturing processes, such as bonding and electrical connection, or with manufacturing processes directly compatible with the slot magazine 402.

It has been discovered that the molded strip 102 having the molded strip protrusion 104 eliminates the need for an additional apparatus (not shown), such as a handling jig, a transport jig, a tool, or a tray, to handle the integrated circuit package system 100 after the strip etch-out phase. Eliminating the additional apparatus also eliminates the need to flip over the mold segment, manually in some processes.

Figure 9:
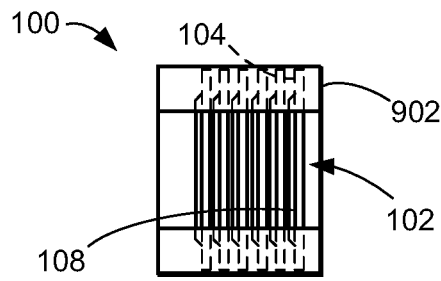
FIG. 9 is a side view of the integrated circuit package system in the strip etch-out molded strip handling phase with a stack magazine.

Referring now to FIG. 9, therein is shown a side view of the integrated circuit package system 100 in the strip etch-out molded strip handling phase with a stack magazine 902. The molded strip 102 having the molded strip protrusion 104, the molded strip bridge 106, and the molded segment 108 can be placed in the stack magazine 902. The stack magazine 902 provides protection for handling or transporting one or more of the molded strip 102. The stack magazine 902 can be used between manufacturing processes, such as marking, singulation, or with manufacturing processes directly compatible with the stack magazine 902.

Figure 10:
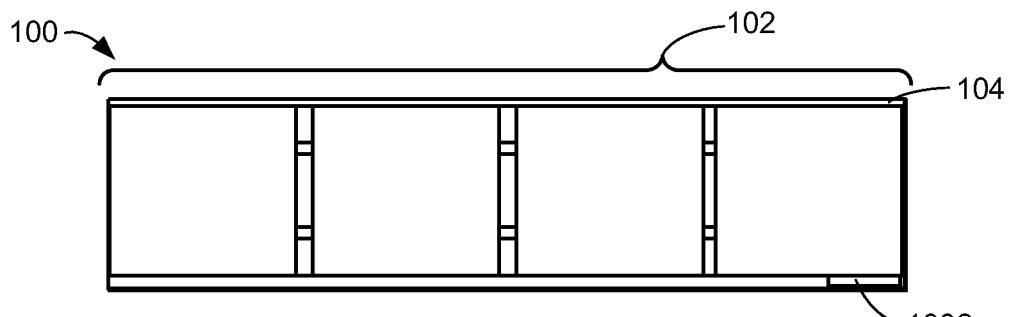
FIG. 10 is a top view of the integrated circuit package system with an optional strip test mark in an embodiment of the present invention.

Referring now to FIG. 10, therein is shown a top view of the integrated circuit package system 100 with an optional strip test mark in an embodiment of the present invention. The molded strip protrusion 104 of the molded strip 102 can include a code 1002, such as a two-dimensional (2D) mark or a three-dimensional (3D) strip test mark. The code 1002 can provide a map or matrix of the devices in the molded strip 102 for testing data. The code 1002 can also include a unique tracking code or device identification for the molded strip 102 or the individual units 304 of FIG. 3 of the molded strip 102. The code 1002 can be marked by a process, such as laser marking or ink marking, on the molded strip protrusion 104.

Figure 11:
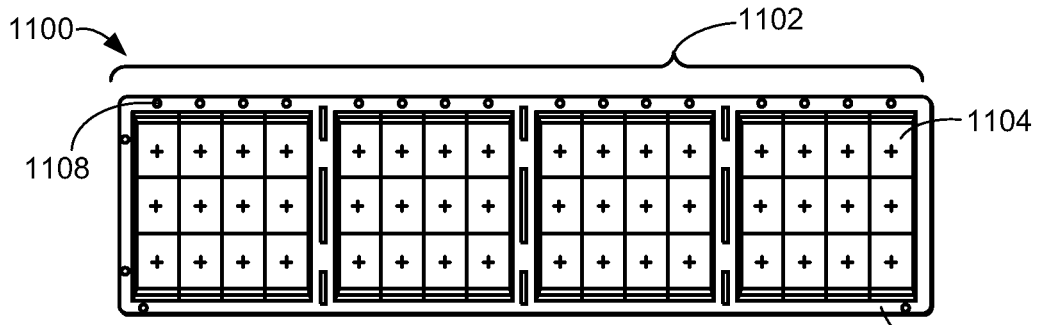
FIG. 11 is a top view of an integrated circuit package system in an in-line strip processing phase in an alternative embodiment of the present invention.

Referring now to FIG. 11, therein is shown a top view of an integrated circuit package system 1100 in an in-line strip processing phase in an alternative embodiment of the present invention. In a manner similar to the integrated circuit package system 100, the integrated circuit package system 1100 includes an in-line strip 1102, such as a copper lead frame array. The in-line strip 1102 includes individual units 1104 and in-line strip rails 1106. The in-line strip rails 1106 also include registration features 1108, such as location holes on the in-line strip rails 1106. The registration features 1108 are substantially exposed to provide positional integrity during manufacturing processes applied to the in-line strip 1102.

Figure 12:
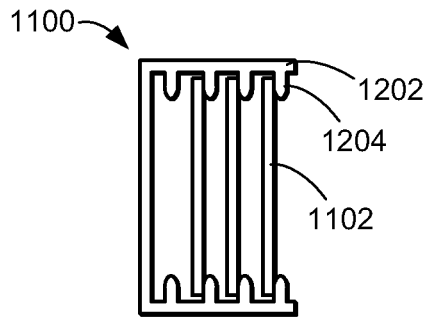
FIG. 12 is a side view of the integrated circuit package system in an in-line strip handling phase.

Referring now to FIG. 12, therein is shown a side view of the integrated circuit package system 1100 in an in-line strip handling phase. The in-line strip 1102 of the integrated circuit package system 1100 can be placed in a slot magazine 1202. The in-line strip 1102 fits between and extends beyond inner extents of slot spacers 1204. The slot magazine 1202 provides protection for handling or transporting one or more of the in-line strip 1102. The slot magazine 1202 can be used between manufacturing processes, such as bonding and electrical connection, or with manufacturing processes directly compatible with the slot magazine 1202.

Figure 13:
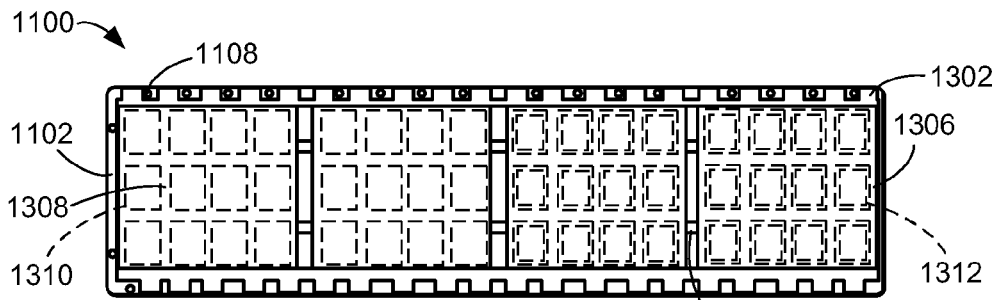
FIG. 13 is a top view of the integrated circuit package system in a molding phase.

Referring now to FIG. 13, therein is shown a top view of the integrated circuit package system 1100 in a molding phase. A molding material 1308, such as an epoxy mold compound, forms a molded strip protrusion 1302, such as a segmented protrusion or an irregular protrusion, a molded strip bridge 1304, and a molded segment 1306, over the in-line strip 1102 and integrated circuit die 1310, such as one or more die, or stacked die 1312. The molded strip protrusion 1302 can provide the registration features 1108 substantially exposed. The molded segment 1306 can be formed over each of the individual units 1104 of FIG. 11. The molded strip bridge 1304 can be formed between the molded segment 1306 and another of the molded segment 1306. The molded strip protrusion 1302, the molded strip bridge 1304, and the molded segment 1306 are formed as connected structures providing structural integrity to the individual units 1104, and can be formed of a single material or multiple materials.

Figure 14:
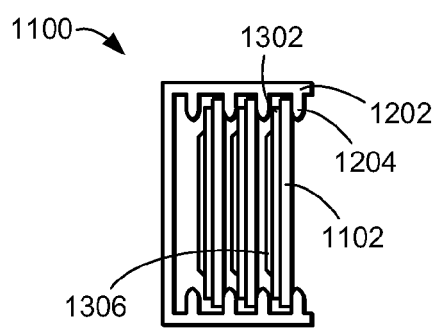
FIG. 14 is a side view of the integrated circuit package system in a molded in-line strip handling phase with a slot magazine.

Referring now to FIG. 14, therein is shown a side view of the integrated circuit package system 1100 in a molded in-line strip handling phase with a slot magazine. The in-line strip 1102 having the molded strip protrusion 1302, the molded strip bridge 1304, and the molded segment 1306 of the molding material 1308 can be placed in the slot magazine 1202. The in-line strip 1102 fits between and extends beyond the inner extents of the slot spacers 1204. The slot magazine 1202 provides protection for handling or transporting one or more of the in-line strip 1102. The slot magazine 1202 can be used between manufacturing processes, such as bonding and electrical connection, or with manufacturing processes directly compatible with the slot magazine 1202.

Figure 15:
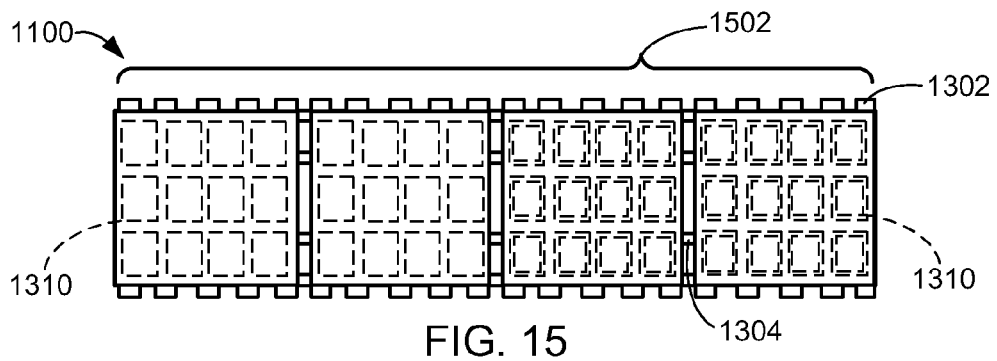
FIG. 15 is a top view of the integrated circuit package system in a strip etch-out molded strip phase.

Referring now to FIG. 15, therein is shown a top view of the integrated circuit package system 1100 in a strip etch-out molded strip phase. The in-line strip 1102 of FIG. 11 can be removed to provide electrical singulation of the individual units 1104 of FIG. 11 and an area with the integrated circuit die 1310 or the stacked die 1312. The molded strip protrusion 1302, the molded strip bridge 1304, and the molded segment 1306 form a molded strip 1502 and provide structural integrity to the individual units 1104.

Figure 16:
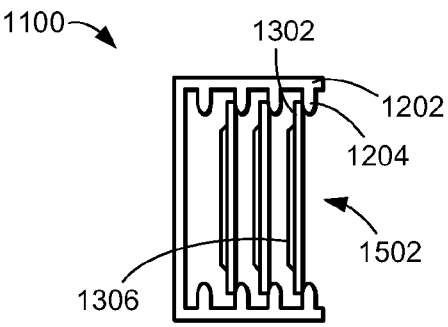
FIG. 16 is a side view of the integrated circuit package system in a strip etch-out molded strip handling phase.

Referring now to FIG. 16, therein is shown a side view of the integrated circuit package system 1100 in a strip etch-out molded strip handling phase. The molded strip 1502 having the molded strip protrusion 1302, the molded strip bridge 1304 of FIG. 13, and the molded segment 1306 can be placed in the slot magazine 1202. The molded strip protrusion 1302 fits between and extends beyond the inner extents of the slot spacers 1204. The slot magazine 1202 provides protection for handling or transporting one or more of the molded strip 1502. The slot magazine 1202 can be used between manufacturing processes, such as bonding and electrical connection, or with manufacturing processes directly compatible with the slot magazine 1202.

Figure 17:
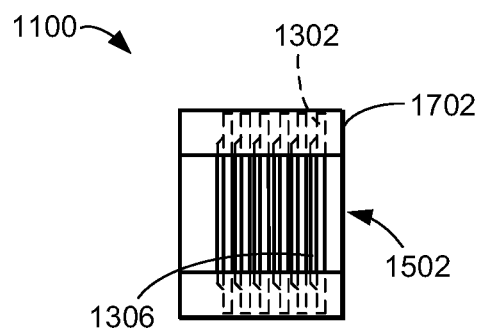
FIG. 17 is a side view of the integrated circuit package system in a strip etch-out molded strip handling phase with a stack magazine.

Referring now to FIG. 17, therein is shown a side view of the integrated circuit package system 1100 in a strip etch-out molded strip handling phase with a stack magazine 1702. The molded strip 1502 having the molded strip protrusion 1302, the molded strip bridge 1304 of FIG. 13, and the molded segment 1306 can be placed in the stack magazine 1702. The stack magazine 1702 provides protection for handling or transporting one or more of the molded strip 1502. The stack magazine 1702 can be used between manufacturing processes, such as bonding and electrical connection, or with manufacturing processes directly compatible with the stack magazine 1702.

Figure 18:
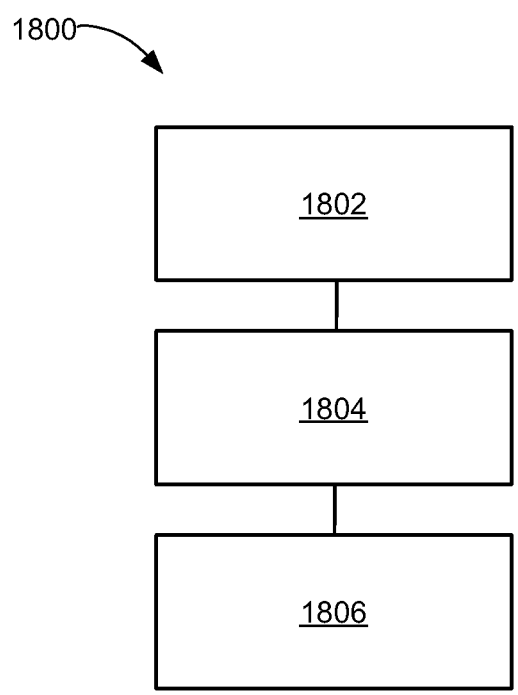
FIG. 18 is a flow chart of an integrated circuit package system for manufacturing the integrated circuit package system in an embodiment of the present invention.

Referring now to FIG. 18, therein is shown a flow chart of an integrated circuit package system 1800 for manufacturing the integrated circuit package system 100 in an embodiment of the present invention. The system 1800 includes providing an in-line strip in a block 1802; attaching an integrated circuit die over the in-line strip in a block 1804; and applying a molding material with a molded segment having a molded strip protrusion formed therefrom over the in-line strip in a block 1806.

In greater detail, a system to provide the method and apparatus of the integrated circuit package system 100, in an embodiment of the present invention, is performed as follows:

1. Providing an in-line strip having an individualized unit.
2. Mounting an integrated circuit die over the individualized unit.
3. Forming a molding material having a molded strip protrusion over the in-line strip and a molded segment, having a thickness greater than or equal to the molded strip protrusion formed therefrom, over the integrated circuit die.

Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hitherto fore set forth herein or shown in the accompanying drawings are to be interpreted in an illustrative and non-limiting sense.

What is claimed is:

1. A method for manufacturing an integrated circuit package system comprising:
   providing an in-line strip;
   attaching an integrated circuit die over the in-line strip; and
   applying a molding material to form a molded strip over the in-line strip, wherein the molded strip includes a molded segment over the integrated circuit die, a molded strip bridge between the molded segment, and a molded strip protrusion surrounding the molded segment along an edge of the in-line strip.

2. The method as claimed in claim 1 wherein applying the molding material includes forming a guide rail on only two sides of the molded segment or surrounding the molded segment.

3. The method as claimed in claim 1 wherein applying the molding material includes forming a segmented protrusion.

4. The method as claimed in claim 1 further comprising marking a code on the molded strip protrusion.

5. The method as claimed in claim 1 wherein applying the molding material includes forming the molded strip protrusion to cooperate with a slot magazine or a stack magazine.

6. A method for manufacturing an integrated circuit package system comprising:
   providing an in-line strip having an individualized unit;
   mounting an integrated circuit die over the individualized unit; and
   forming a molded strip over the in-line strip, further comprising:
   forming a molded segment over the integrated circuit die;
   forming a molded strip bridge between the molded segment; and
   forming a molded strip protrusion surrounding the molded segment along an edge of the in-line strip, wherein the molded strip protrusion has a thickness thinner than or equal to the molded segment, and the width of the molded strip is less than or equal to the in-line strip.

7. The method as claimed in claim 6 wherein forming the molded strip includes forming a guide rail for process handling.

8. The method as claimed in claim 6 wherein forming the molded strip includes forming a segmented protrusion with registration features of the in-line strip substantially exposed.

9. The method as claimed in claim 6 further comprising marking a code on the molded strip protrusion for a strip test.

10. The method as claimed in claim 6 wherein forming the molded strip includes forming the molded strip protrusion to cooperate with a slot spacer of a slot magazine or a stack magazine.

11. An integrated circuit package system comprising:
    an in-line strip;
    an integrated circuit die over the in-line strip; and
    a molded strip over the in-line strip consisting of a molded segment over the integrated circuit die, a molded strip bridge between the molded segment, and a molded strip protrusion surrounding the molded segment along an edge of the in-line strip.

12. The system as claimed in claim 11 wherein the molded strip includes a guide rail on only two sides of the molded segment or surrounding the molded segment.

13. The system as claimed in claim 11 wherein the molded strip includes a segmented protrusion.

14. The system as claimed in claim 11 wherein the molded strip protrusion includes a code.

15. The system as claimed in claim 11 wherein the molded strip includes the molded strip protrusion formed to cooperate with a slot magazine or a stack magazine.

16. The system as claimed in claim 11 wherein:
    the in-line strip is the in-line strip having an individualized unit;
    the integrated circuit die is the integrated circuit die over the individualized unit; and
    the molded segment has a thickness greater than or equal to the molded strip protrusion.

17. The system as claimed in claim 16 wherein the molded strip includes a guide rail for process handling.

18. The system as claimed in claim 16 wherein the molded strip includes a segmented protrusion with registration features of the in-line strip substantially exposed.

19. The system as claimed in claim 16 wherein the molded strip protrusion includes a code for strip a test.

20. The system as claimed in claim 16 wherein the molded strip includes the molded strip protrusion formed to cooperate with a slot spacer of a slot magazine or a stack magazine.

\* \* \* \* \*